United States Patent
Moriyama et al.

(10) Patent No.: US 7,075,813 B2
(45) Date of Patent: Jul. 11, 2006

(54) STORAGE DEVICE USING RESISTANCE VARYING STORAGE ELEMENT AND REFERENCE RESISTANCE VALUE DECISION METHOD FOR THE DEVICE

(75) Inventors: Katsutoshi Moriyama, Saga (JP); Yutaka Higo, Miyagi (JP)

(73) Assignee: Sony Corporation, Tokyo (JP)

( * ) Notice: Subject to any disclaimer, the term of this patent is extended or adjusted under 35 U.S.C. 154(b) by 109 days.

(21) Appl. No.: 10/510,087

(22) PCT Filed: Apr. 16, 2003

(86) PCT No.: PCT/JP03/04859

§ 371 (c)(1),
(2), (4) Date: Oct. 1, 2004

(87) PCT Pub. No.: WO03/088254

PCT Pub. Date: Oct. 23, 2003

(65) Prior Publication Data

US 2005/0122816 A1    Jun. 9, 2005

(30) Foreign Application Priority Data

Apr. 17, 2002    (JP)    ............................. 2002-115010

(51) Int. Cl.
*G11C 11/00* (2006.01)
(52) U.S. Cl. ...................... 365/148; 365/210
(58) Field of Classification Search ................ 365/148, 365/210, 158, 171
See application file for complete search history.

(56) References Cited

U.S. PATENT DOCUMENTS

| | | | |
|---|---|---|---|
| 6,055,178 A | 4/2000 | Naji | |
| 6,269,040 B1* | 7/2001 | Reohr et al. | 365/210 |
| 6,862,213 B1* | 3/2005 | Hamaguchi | 365/158 |
| 6,990,015 B1* | 1/2006 | Honda et al. | 365/173 |
| 7,006,371 B1* | 2/2006 | Matsuoka | 365/148 |
| 2006/0002174 A1* | 1/2006 | Hosoi et al. | 365/148 |

FOREIGN PATENT DOCUMENTS

JP    2002-533863    10/2002

* cited by examiner

*Primary Examiner*—Anh Phung
(74) *Attorney, Agent, or Firm*—Sonnenschein Nath & Rosenthal LLP

(57) ABSTRACT

A memory apparatus capable of accurately reading out data stored in a memory element of variable resistance. The memory apparatus using a memory element of variable resistance whose resistance is variable between a high resistance state having a higher resistance than the resistance of the reference resistance element and a low resistance state having a lower resistance than the resistance of the reference resistance element, wherein the reference circuit of the resistance element and the reference resistance element connected in series between two reference potential terminals of different potentials and the memory circuit of a series connection of the resistance element and the memory element of variable resistance with the reference circuit and the memory circuit connected in parallel with each other, and the reference resistance element is constructed to have a variable resistance.

8 Claims, 12 Drawing Sheets

STORAGE DEVICE USING RESISTANCE VARYING STORAGE ELEMENT AND REFERENCE RESISTANCE VALUE DECISION METHOD FOR THE DEVICE

BACKGROUND OF THE INVENTION

The present invention relates to a storage unit using a memory element of variable resistance and a method of determining a reference resistance thereof.

In recent years, there are strong needs for storage unit for computer having performances such as high writing speed, non-limitation in number of writings and yet non-volatile, and thus attracting designers' attention as storage media having these performances is a ferromagnetic tunnel junction device which is made by laminating a fixed magnetization layer and a free magnetization layer by way of a tunnel barrier layer.

Such ferromagnetic tunnel junction device has a characteristic that the resistance of the tunnel barrier layer becomes lower than the resistance (reference resistance) of a resistance element to be referred (a reference resistance element) in case when the free magnetization layer is magnetized in the same magnetization direction as the fixed magnetization layer, while the resistance of the tunnel barrier layer increasing higher than the reference resistance in case when the free magnetization layer is magnetized in the opposite direction to the magnetization direction of the fixed magnetization layer.

In addition, by utilizing the above mentioned characteristic to exhibit different resistance of the tunnel barrier layer in response to the magnetization direction of the free magnetization layer, the ferromagnetic tunnel junction device provides two different states in the magnetization direction depending on whether the free magnetization layer is magnetized in the same magnetization direction as that of the fixed magnetization layer or magnetized in the opposite magnetization direction to that of the fixed magnetization layer and the ferromagnetic tunnel junction device is made to store data by defining such two different magnetization states as the data "0" or "1".

As described above, the ferromagnetic tunnel junction device is acting as a memory element of variable resistance which takes a high resistance state having a higher resistance than the resistance of the reference resistance element or a low resistance state having a lower resistance than the resistance of the reference resistance element depending on the two kinds of data to be stored.

A storage unit utilizing such memory element of variable resistance as the memory medium is designed to read out the data from the memory element of variable resistance by making a judgment which of the two kinds of data is stored in the memory element of variable resistance. It is therefore necessary to make a judgment if the memory element of variable resistance is in the high resistance state or in the low resistance state.

A known storage unit to make a judgment if such memory element of variable resistance is in the high resistance state or in the low resistance state can be classified into two kinds which will be described hereunder.

In other words, in order to store a single data, a first conventional storage unit includes a pair of (or two) resistance change memory elements which constitute a main element and a sub element and are formed on a common semiconductor substrate. The main memory element of variable resistance is made to exhibit the resistance state corresponding to the data to be stored, while the sub memory element of variable resistance is made to exhibit the resistance state opposite to that of the main memory element of variable resistance. Comparison is made on resistances of these two memory elements of variable resistance to determine that the main memory element of variable resistance is in the high resistance state if the resistance of the main resistance change device is higher than that of the sub memory element of variable resistance, while the main memory element of variable resistance is in the low resistance state if the resistance of the main memory element of variable resistance is lower than that of the sub memory element of variable resistance.

In addition, a second conventional storage unit includes a single reference resistance element for a plurality of memory elements of variable resistance formed on a common semiconductor substrate. The resistance of the reference resistance element is set to the resistance between the resistance of the memory element of variable resistance in the high resistance state and the resistance in the low resistance state. It is determined that the memory element of variable resistance is in the high resistance state if the resistance of the memory element of variable resistance is higher than the resistance of the reference resistance element, while the memory element of variable resistance is in the low resistance state if the resistance of the memory element of variable resistance is lower than the resistance of the reference resistance element.

However, the first conventional memory apparatus as described hereinabove is required to form on a common semiconductor substrate two memory elements of variable resistance, i.e., the main memory element of variable resistance and the sub memory element of variable resistance for storing a single data, thereby doubling the number of memory elements of variable resistance to be formed on the semiconductor substrate, thereby making the storage unit less compact and increasing the production cost because a large number of memory elements of variable resistance must be fabricated more precisely.

In addition, in the second conventional storage unit as mentioned hereinabove, resistance values in the high resistance state and the low resistance state of the memory elements of variable resistance are most likely to change depending on the fabrication process. Moreover, since there is no significant difference between both resistance values, it was very difficult in the design stage to previously set the resistance of the reference resistance element to the resistance between the resistance values of the memory element of variable resistance in the high resistance state and in the low resistance state.

Also, since the resistance of the reference resistance element itself tends to vary depending on the fabrication process, it is possible that the resistance of the reference resistance element may not be the resistance between the resistance values of the memory elements of variable resistance in the high resistance state and in the low resistance state. In such a case, judgment of the storage state of the memory element of variable resistance may be made incorrectly, thereby making it impossible to correctly read out the stored data from the memory element of variable resistance.

It is therefore an object of the present invention to provide a storage unit of a structure using the reference resistance element in the second conventional memory apparatus as described hereinabove in order to avoid increasing the number of memory elements of variable resistance which are formed on a semiconductor substrate and yet capable of varying the resistance of the reference resistance element so that the stored data can be accurately read out of the memory element of variable resistance even if there are differences in the resistance value of the memory element of variable resistance and the reference resistance element.

SUMMARY OF THE INVENTION

In other words, the present invention as defined in claim 1 has a structure in which a storage unit using a memory element of variable resistance which changes between a high resistance state to exhibit a higher resistance than the resistance of a reference resistance element and a low resistance state to exhibit a lower resistance than the resistance of the reference resistance element in response to two kinds of data to be stored, wherein the resistance of the reference resistor is made variable.

In addition, the present invention as defined in claim 2 has a structure in which a storage unit using a memory element of variable resistance which changes between a high resistance state having a higher resistance than a resistance of a reference resistance element and a low resistance state having a lower resistance than the resistance of the reference resistance element in response to two kinds of data to be stored, the memory apparatus using a memory element of variable resistance characterized by a structure in which a reference circuit, made of a first resistance element and the reference resistance element connected in series between reference potential terminals set to different potentials, and a memory circuit, made of a second resistance element and the memory element of changeable resistance connected in series, are connected in parallel, wherein the resistance of the reference resistance is variable.

In addition, the present invention as defined in claim 3 has a structure in which a storage unit using memory elements of variable resistance which changes between a high resistance state having a higher resistance than a resistance of a reference resistance element and a low resistance state having a lower resistance than the resistance of the reference resistance element in response to two kinds of data to be stored, the memory apparatus using a memory element of variable resistance characterized by a structure in which a reference circuit, made of a first resistance element and the reference resistance element connected in series between reference potential terminals set to different potentials, and a memory circuit, made of a second resistance element and a memory element of variable resistance selected from a plurality of memory elements of variable resistances connected in series, both connected in parallel, wherein the resistance of the reference resistance is variable.

In addition, the present invention as defined in claim 4 is the invention as defined in claim 2 or 3, wherein the resistance of the second resistance element is made variable.

In addition, the present invention as defined in claim 5 is the invention as defined in either one of the claims 2–4, wherein the first resistance element has the same resistance as the resistance of the second resistance element.

In addition, the present invention as defined in claim 6 is the invention as defined in any of claims 2 to 5, wherein an electric potential on a junction between the first resistance element and the reference resistance element is a reference potential, the potential on a junction between the second resistance element and the memory element of variable resistance is a memory potential, and comparison is made between the reference potential and the memory potential to judge that the resistance of the memory element of variable resistance is in a high resistance state if the memory potential is higher than the reference potential, while the memory element of variable resistance is in a low resistance state if the memory potential is lower than the reference potential.

In addition, the present invention as defined in claim 7 has a structure in which a storage unit using a plurality of memory elements of variable resistance which change between a high resistance state having a higher resistance than a reference resistance and a lower resistance state having a lower resistance than the reference resistance in response to two kinds of data to be stored, wherein the reference resistance is determined as a resistance between a lowest resistance among the memory elements of variable resistances in the high resistance state and the highest resistance in the low resistance state.

In addition, in the present invention as defined in claim 8, a lowest resistance among part of a plurality of memory elements of variable resistance in a high resistance state is set as a temporary reference resistance; a lowest resistance among memory elements of variable resistance within the remaining memory elements of variable resistance determined as having lower resistance than the temporary reference resistance in the high resistance state is set as a lowest resistance in the high resistance state; a highest resistance among part of the plurality of memory elements of variable resistance in a low resistance state is set as a temporary reference resistance; a highest resistance among memory elements of variable resistance within the remaining memory elements of variable resistance determined as having higher resistance than the temporary reference resistance in the low resistance state is set as a highest resistance in the low resistance state; and a resistance between the lowest resistance in the high resistance state and the highest resistance in the low resistance state is determined as the reference resistance.

DETAILED DESCRIPTION OF THE PRESENTLY PREFERRED EMBODIMENTS

Figure 1:
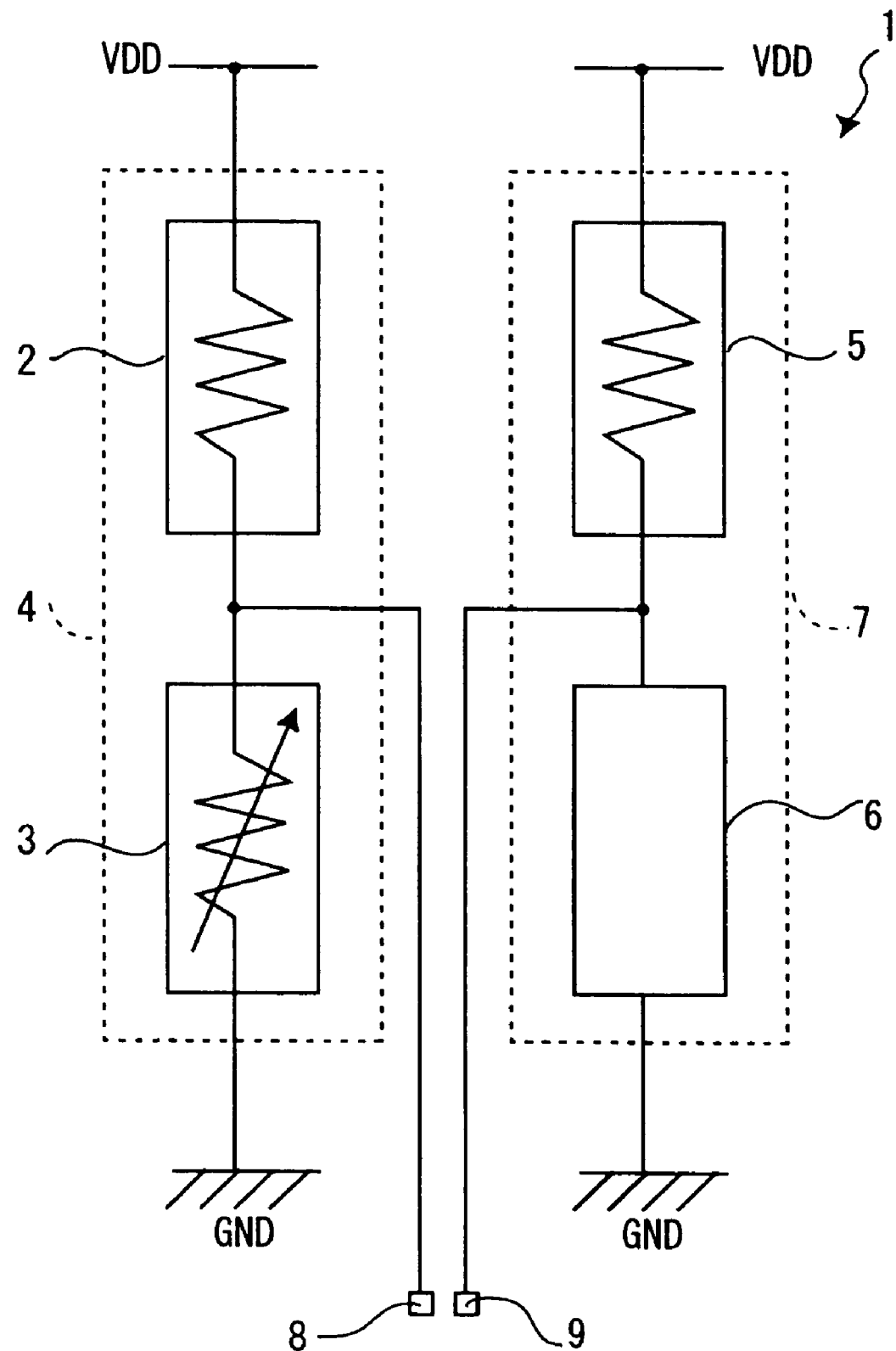
FIG. 1 is a circuit diagram of a storage unit according to the present invention.

The storage unit according to the present invention is the one using a memory element of variable resistance (for example, a ferromagnetic tunnel junction device) which changes between a high resistance state to exhibit a higher resistance than the resistance of a reference resistance element and a low resistance state to exhibit a lower resistance than the resistance of the reference resistance element in response to two kinds of data to be stored.

In addition, it is a parallel connection of a reference circuit which includes a resistance element and a reference resistance element connected between two reference potential terminals set to different potentials connected in series and a memory circuit of a series connection of a resistance element and a memory element of variable resistance.

Moreover, the reference resistance element is constructed to provide a variable resistance.

For this end, employed is a simple and less expensive structure so that accurate judgment of the storage condition of the memory element of variable resistance can be made even if there is any individual difference in resistance of memory element of variable resistance by varying the resistance of the reference resistance element between the resistance of the memory elements of variable resistance in the high resistance state and the resistance thereof in the low resistance state, thereby enabling to accurately read out the data stored in the memory element of variable resistance.

In particular, in case of varying the resistance of the resistance elements in the memory circuit, adjustment is made on the voltage to be applied to the memory element of variable resistance to the optimum voltage by increasing or decreasing the resistance of the resistance element in the memory circuit, thereby extending the lifetime of the memory element of variable resistance.

In addition, in case of varying the resistance of the resistance element in the reference circuit equal to the resistance of the resistance element in the memory circuit, the voltage to be applied to the memory element of variable resistance is equal to the voltage to be applied to the reference resistance element, thereby making the resistance of the reference resistance element is equal to the resistance of the memory elements of variable resistance without any modification. Accordingly, the measurement of the resistance of the reference resistance element is equivalent to the measurement of the resistance of the memory element of variable resistance, thereby enabling to indirectly measure the resistance of the memory element of variable resistance and thus immediately making judgment of the storage condition of the memory element of variable resistance.

Also, the resistance state of the memory element of variable resistance can be judged by a relatively simple and less expensive circuit structure which compares a reference potential on the junction of a resistance element and a reference resistance element in a reference circuit and a memory potential on the junction of a resistance element and a memory element of variable resistance in a memory circuit, and making a judgment that the resistance state of the memory element of variable resistance is in a high resistance state if the memory potential is higher than the reference potential, while the resistance state of the memory element of variable resistance is in a low resistance state if the memory potential is lower than the reference potential, thereby enabling to make a judgment of the resistance state of the memory element of variable resistance from the potential difference between the reference potential and the memory potential.

Also, in case of determining the reference resistance to a resistance between the lowest resistance of the memory elements of variable resistance in the high resistance state and the highest resistance of the memory elements of variable resistance in the low resistance state, the resistance of the reference resistance element can be set to a resistance between the resistance of the memory elements of variable resistance in the high resistance state and the resistance in the low resistance state even if there are individual differences in the resistance of the memory elements of variable resistance, thereby enabling to make an accurate judgment of the storage condition of the memory elements of variable resistance and to accurately read out the data stored in the memory elements of variable resistance.

In addition, the lowest resistance of part of memory elements of variable resistance among a plurality of memory elements of variable resistance in a high resistance state is set as a temporary reference resistance, and the lowest resistance among the resistances of the remaining memory elements of variable resistance in which the resistance in the high resistance state is determined to be lower than the temporary reference resistance is determined as the final lowest resistance in the high resistance state and, on the other hand, the highest resistance of part of the memory elements of variable resistance among the plurality of memory elements of variable resistance in a low resistance state is determined as a temporary reference resistance, and the highest resistance among the resistances of the remaining memory elements of variable resistance in which the resistance in the low resistance state is determined higher than the temporary reference resistance is determined as the final highest reference resistance, thereby setting a resistance between the lowest resistance in the high resistance state and the highest resistance in the low resistance state as the reference resistance for reducing the number of detections of the resistances of the memory elements of variable resistance required for determining the reference resistance and thus enabling to determine the reference resistance in a shorter time.

Now, concrete embodiments of the present invention will be described hereinafter by reference to the drawings.

As shown in FIG. 1, the storage unit 1 according to the present invention includes a reference circuit 4 which includes a first resistance element 2 and a reference resistance element 3 connected in series between a power supply terminal VDD and a ground terminal GND constituting two reference potential terminals of different potentials, and a memory circuit 7 which includes a series connection of a second resistance element 5 and a ferromagnetic tunnel junction device as a memory element of variable resistance 6 with the reference circuit 4 and the memory circuit 7 connected in parallel with each other.

Also, the storage unit 1 has a reference potential terminal 8 connected to the junction of the first resistance element 2 and the reference resistance element 3 which constitute the reference circuit 4 as well as a storage potential terminal 9 connected to the junction of the second resistance element 5 and the memory element of variable resistance 6 which constitute the memory circuit 7. Here, the potential on the reference potential terminal 8, i.e., the potential on the junction of the first resistance element 2 and the reference resistance element 3 is referred to as the reference potential. On the other hand, the potential on the storage potential terminal, i.e., the potential on the junction of the second resistance element 5 and the memory element of variable resistance 6 is referred to as the storage potential.

In the storage unit 1 of the structure as described hereinabove, the first resistance element 2 and the second resistance element 5 may be any member having a resistance to develop a voltage drop across two terminals thereof and each element may be a single resistor, a plurality of resistors connected in serial or parallel, or even an ON resistance of a transistor.

It is to be noted herein that the memory element of variable resistance 6 means any device such as, for example, a ferromagnetic tunnel junction device which changes between a high resistance state to exhibit a higher resistance than the resistance of the reference resistance element 3 and a low resistance state to exhibit a lower resistance than the resistance of the reference resistance element in response to two kinds of data (for example, "0" or "1") to be stored.

The reference resistance element 3 is constructed so that the resistance can be varied and may include a single variable resistor, a plurality of variable resistors connected in series or parallel with one another or even a transistor whose ON resistance is variable in response to the voltage applied to the gate of such transistor.

In the storage circuit 1 of the structure as described hereinabove, by directly measuring the resistance between the reference potential terminal 9 and the ground terminal GND, the resistance is equal to the resistance of the memory element of variable resistance 6. This means that the direct measurement of the resistance between the reference potential terminal 8 and the ground terminal GND provides the resistance measurement of the memory element of variable resistance 6 and thus comparison of such resistance and the reference resistance provides means to make judgment whether the memory element of variable resistance 6 is in the high resistance state or in the low resistance state.

Also, it is possible to indirectly measure the resistance of the memory element of variable resistance 6 without making a direct measurement. In other words, if the resistance of the first resistance element 2 and that of the second resistance element 5 are equalized and if the resistance of the reference resistance element 3 is adjusted so that the reference potential is equal to the storage potential, the resistance of the reference resistance element 3 under such condition is equal to the resistance of the memory element of variable resistance 6, thereby enabling to indirectly measure the resistance of the memory element of variable resistance 6 by measuring the resistance of the reference resistance element 3. It is to be noted also that, without equalizing the resistance of the first resistance element 2 and the resistance of the second resistance element 5, if the resistance of the reference resistance element 3 is adjusted so that the reference potential is equal to the storage potential, the resistance of the memory element of variable resistance 6 can be calculated from the resistance ratio of the reference resistance element 3 and the first resistance element 2 and the resistance of the second resistance element 5 under such condition, thereby indirectly measuring the resistance of the memory element of variable resistance 6.

In this sense, since the resistance of the memory element of variable resistance 6 can be indirectly measured from the reference potential and the storage potential without directly measuring the resistance of the memory element of variable resistance 6 as described hereinabove, by setting the resistance of the reference resistance element 3 to a resistance between the resistance of the memory element of variable resistance 6 in the high resistance state and the resistance in the low resistance state, comparison of the reference potential and the storage potential enables to make a judgment whether the storage state of the memory element of variable resistance 6 is in the high resistance state or in the low resistance state.

In other words, in case when the storage potential is higher than the reference potential, the resistance of the memory element of variable resistance 6 is higher than the resistance of the reference resistance element 3, thereby enabling to judge that the memory element of variable resistance 6 is in the high resistance state. On the other hand, in case when the storage potential is lower than the reference potential, the resistance of the memory element of variable resistance 6 is lower than the resistance of the reference resistance element 3, thereby enabling to judge that the memory element of variable resistance 6 is in the low resistance state.

Figure 2:
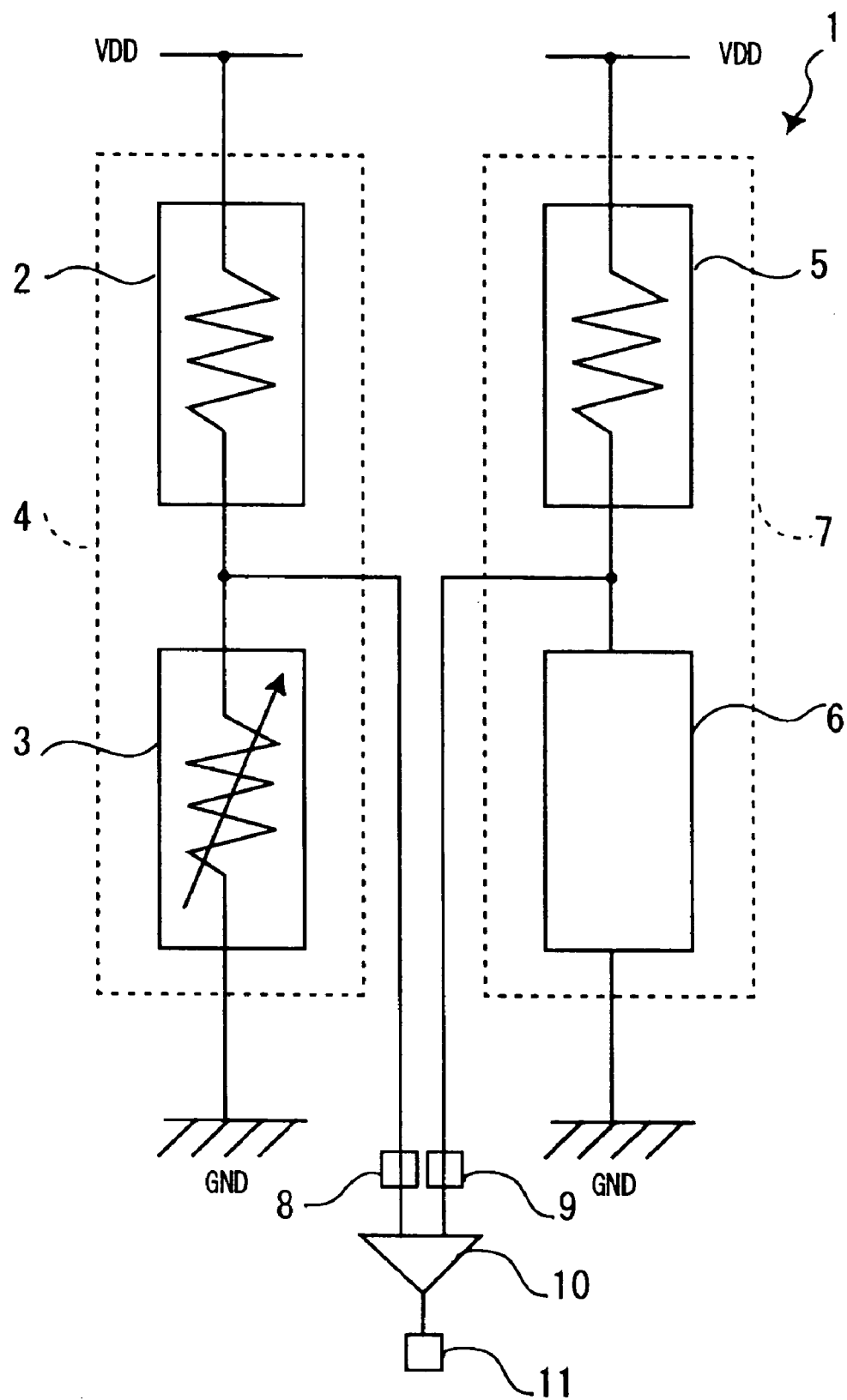
FIG. 2 is a circuit diagram of a storage unit including an additional sense amplifier.

Accordingly, as shown in FIG. 2, a sense amplifier 10 is connected to the reference potential terminal 8 and the storage potential terminal 9 for making comparison of the reference potential and the storage potential by the sense amplifier 10. If the storage potential is higher than the reference potential, the sense amplifier 10 outputs an "H (High) signal" onto its output terminal 11. On the other hand, if the storage potential is lower than the reference potential, the sense amplifier 10 outputs an "L (Low) signal" onto its output terminal 11. In this manner, the output signal on the output terminal 11 of the sense amplifier 10 indicates whether the memory element of variable resistance 6 is in the high resistance state or in the low resistance state, thereby reading out the data stored in the memory element of variable resistance 6 from such memory element of variable resistance 6.

As described hereinabove, since the storage unit 1 is constructed to change the resistance of the reference resistance element 3, it provides a simple and less expensive circuit structure by changing the resistance of the reference resistance element 3 to a resistance between the resistance in the high resistance state and the resistance in the low resistance state of the memory element of variable resistance 6 even if its resistance may have an individual difference. This ensures more accurate judgment of the storage condition of the memory element of variable resistance 6 and also accurate read-out of the stored data in the memory element of variable resistance 6.

Although the resistance of the second resistance element 5 constituting the memory circuit 7 is fixed in the above mentioned storage unit 1, the resistance of the second resistance element 5 is constructed to be variable.

Figure 3:
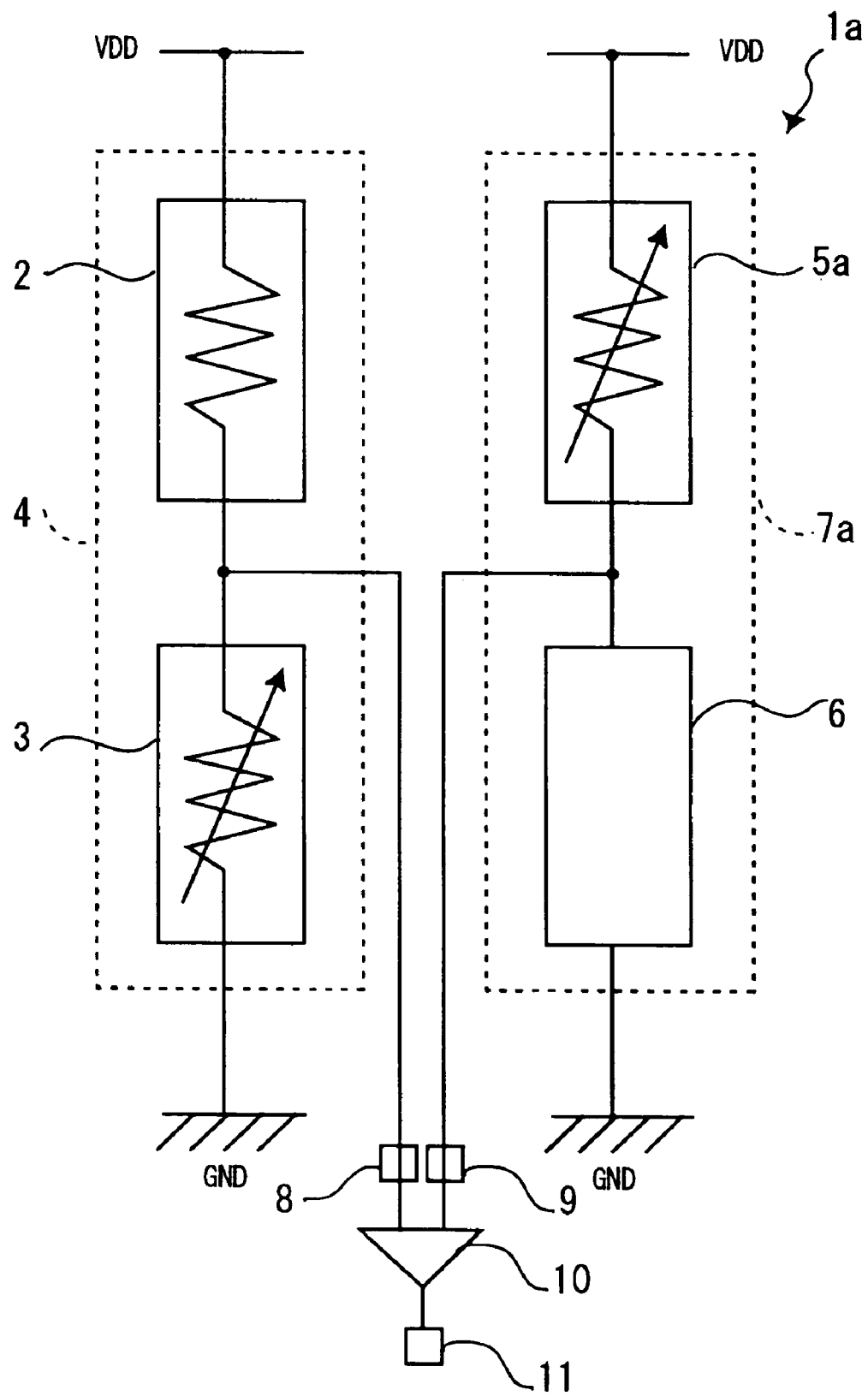
FIG. 3 is a circuit diagram of a storage unit according to another embodiment of the present invention.

In other words, FIG. 3 is a circuit diagram of a storage unit 1a in which the resistance of the second resistance element 5a is made variable.

It is to be noted here that the second resistance element 5a may be a single variable resistor or a serial or parallel connection of a plurality of variable resistors. Additionally, it may be a transistor whose ON resistance can be variable in response to the voltage applied to the gate of the transistor.

As described hereinabove, in case of making the resistance of the second resistance element 5a variable, the voltage applied across the memory element of variable resistance 6 can be increased or decreased by varying the resistance of the second resistance element 5a, thereby enabling to adjust the voltage across the memory element of variable resistance 6 to an appropriate voltage and thus extending the lifetime of the memory element of variable resistance 6.

Also, the resistance of the first resistance element 2 which constitutes the reference circuit 4 may not necessarily be fixed like the storage unit 1 as described hereinabove, but it may be variable.

Figure 4:
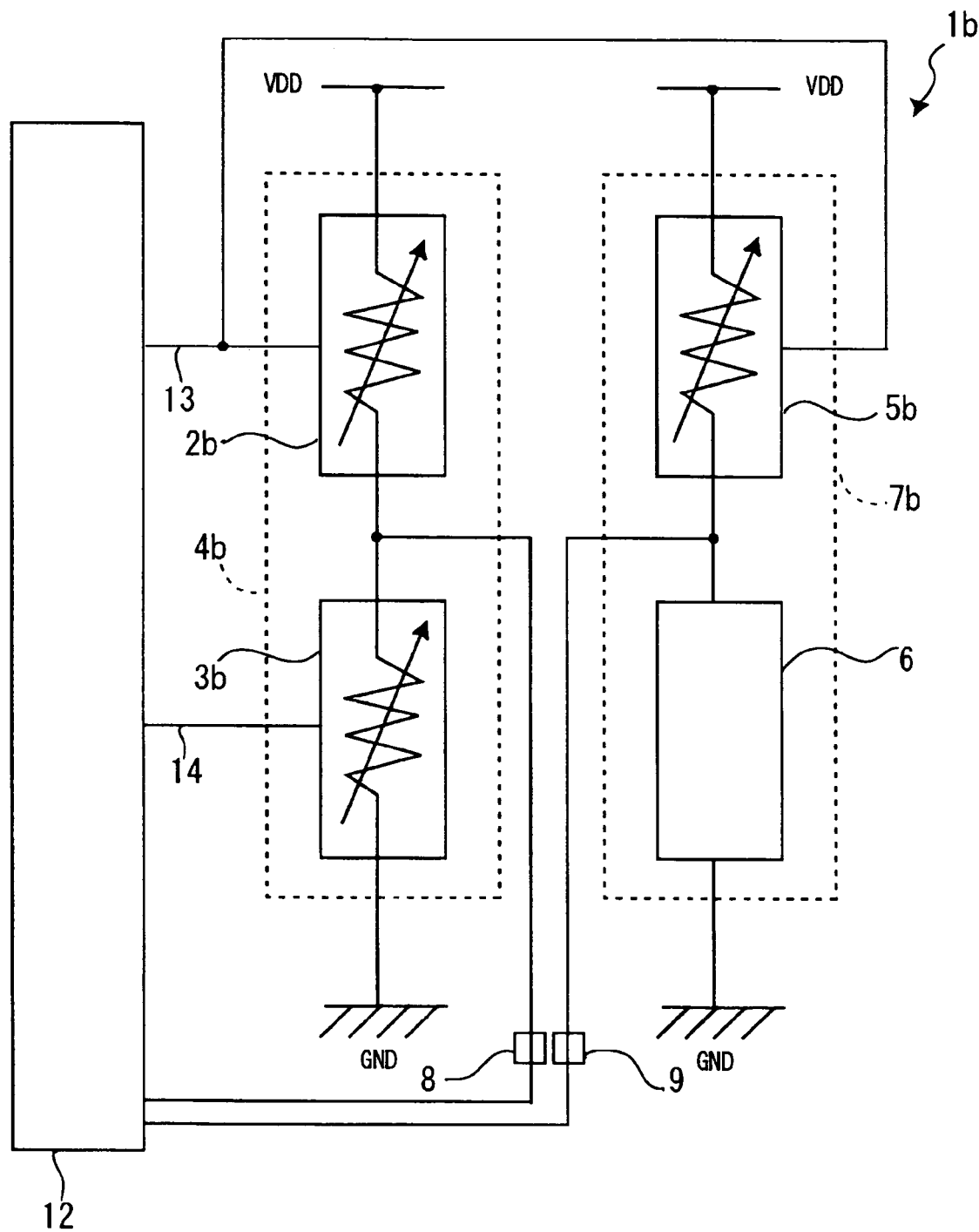
FIG. 4 is a circuit diagram of a storage unit according to another embodiment of the present invention.

In other words, FIG. 4 is a circuit diagram of a storage unit 1*b* in which the resistance of the first resistance element 2*b* constituting the reference circuit 4*b* and the resistance of the second resistance element 5*b* constituting the memory circuit 7*b* are made variable. In such storage unit 1*b*, a control unit 12 is connected to the first resistance element 2*b* and the second resistance element 5*b* by way of a resistance control line 13, wherein the control unit 12 outputs a resistance control signal for varying the resistance of the first resistance element 2*b* equal to the resistance of the second resistance element 5*b*.

Also, in this particular storage unit 1*b*, the control unit 12 is connected to the reference resistance element 3*b* by way of a reference resistance control signal line 14 for varying the resistance of the reference resistance element 3*b* by the reference resistance control signal outputted from the control unit 12.

Furthermore, in the storage unit 1*b*, the control unit 12 is connected to the reference potential terminal 8 and the storage potential terminal 9 for making comparison of the reference potential and the storage potential by the control unit 12, thereby making judgment of the storage condition of the memory element of variable resistance 6.

In this way, in case of configuring to vary the resistance of the first resistance element 2*b* equal to the resistance of the second resistance element 5*b* as described hereinabove, the resistance of the reference resistance element 3*b* is adjusted so that the voltage applied across the memory element of variable resistance 6 is equal to the voltage across the reference resistance element 3*b*. This means that the resistance of the reference resistance element 3*b* is equal to the resistance of the memory element of variable resistance 6 and the measurement of the resistance of the reference resistance element 3*b* is equal to the measurement of the resistance of the memory element of variable resistance 6. Accordingly, measuring the resistance of the reference resistance element 3*b* is equivalent to measuring the resistance of the memory element of variable resistance 6, thereby enabling to indirectly measure the resistance of the memory element of variable resistance 6 and thus making immediate judgment of the storage condition of the memory element of variable resistance 6.

In the storage units 1, 1*a* and 1*b* as described hereinabove, although a single memory element of variable resistance 6 is used for simplifying the description, it is normal that a plurality of memory elements of variable resistance 6 are used.

Figure 5:
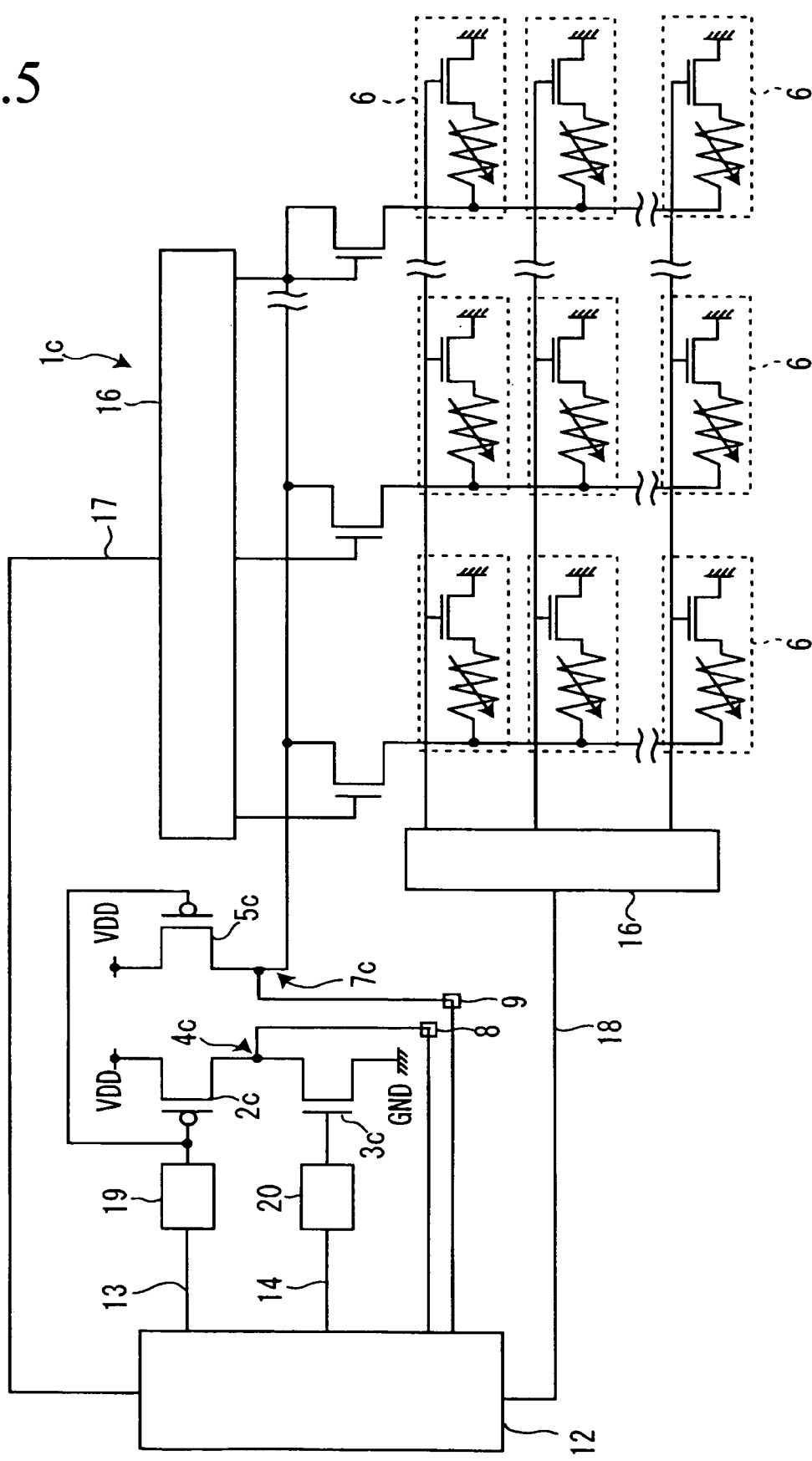
FIG. 5 is a circuit diagram of a storage unit according to another embodiment of the present invention.

In other words, FIG. 5 is a circuit diagram of a storage unit 1*c* using a plurality of memory elements of variable resistance 6. In such storage unit 1*c*, a line address decoder 15 and a column address decoder 16 are connected to a plurality of memory elements of variable resistance 6. The control unit 12 is connected to the line address decoder 15 and the column address decoder 16 by way of address signal lines 17, 18, respectively. A single memory element of variable resistance 6 is selected from a plurality of memory elements of variable resistance 6 by the line address decoder 15 and the column address decoder 16 based on the address signals outputted from the control unit 12, thereby making such single memory element of variable resistance 6 to become conductive.

In addition, in the storage unit 1*c*, pMOS transistors are used as the first resistance element 2*c* which constitutes the reference circuit 4*c* and the second resistance element 5*c* which constitutes the storage circuit 7*c* and an nMOS transistor is used as the reference resistance element 3*c*. Moreover, interposed are D/A converters as converters 19, 20 for converting plural bits of digital control signal into a gate voltage for each transistor in halfway portions of the resistance control signal lines 13*c* and 14*c*.

Also, in this storage unit 1*c*, gate voltages for the pMOS transistors which constitute the first resistance element 2*c* and the second resistance element 5*c* are varied by the converter 19 based on the resistance control signal outputted from the control unit 12, thereby changing the ON resistances of the both transistors. On the other hand, the gate voltage of the nMOS transistor which constitutes the reference resistance element 3*c* is varied by the converter 20 based on the reference resistance control signal outputted from the control unit 12, thereby changing the ON resistance of the nMOS transistor.

Although the control unit 12 is connected to the first resistance element 2*c*, the second resistance element 5*c* and the reference resistance element 3*c* for changing the resistances of the resistance elements 2*c*, 3*c*, 5*c* by the control unit 12 in the storage unit 1*c*, it is possible that the resistances of the resistance elements 2*c*, 3*c*, 5*c* are controlled from outside of the storage unit 1*c*.

Figure 6:
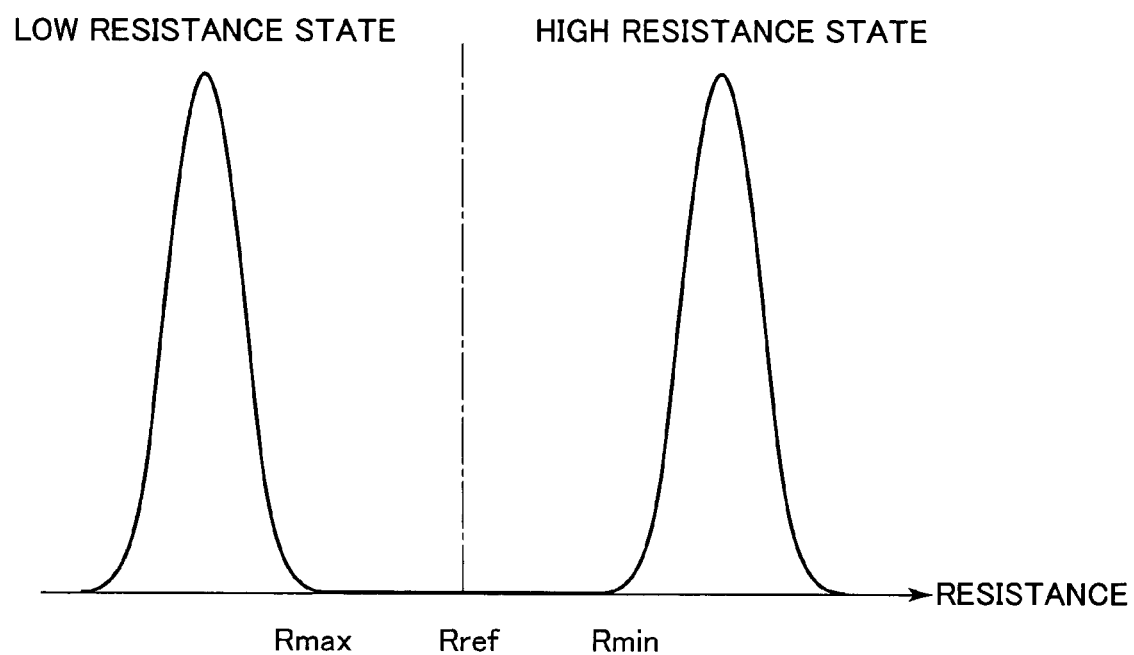
FIG. 6 is a descriptive chart showing resistance states of memory elements of variable resistance.

The storage unit 1*c* uses a plurality of memory elements of variable resistance 6. In case of using such plurality of memory elements of variable resistance 6, resistances in the high resistance state and in the low resistance state of all memory elements of variable resistance 6 are measured in advance for obtaining the resistance distribution as shown in FIG. 6. If the resistance of the reference resistance element 3*c* (reference resistance Rref) is set to a resistance between the lowest resistance (the minimum resistance Rmin) of the resistances in the high resistance state of all of the memory elements of variable resistance 6 and the highest resistance (the maximum Rmax) of the resistances in the low resistance state, judgment of the resistance states of all of the memory elements of variable resistance 6 can be made by using a single reference resistance Rref.

Alternatively, all of the memory elements of variable resistance 6 are divided into plural groups and the reference resistance Rref is obtained for each group. The reference resistance Rref for each group is used so as to judge the resistance state of the memory elements of variable resistance belonging to each group.

Moreover, the resistance of each memory element of variable resistance 6 in the high resistance state and the resistance in the low resistance state are measured and a resistance between these two resistances is stored as the reference resistance Rref for the memory element of variable resistance 6, thereby differentiating the reference resistance Rref for each memory element of variable resistance 6. Then, the respective reference resistance Rref is used to make a judgment of the resistance state of each memory element of variable resistance 6.

As described hereinabove, measurements are made in advance of the resistances in the high resistance state and in the low resistance state of all of the memory elements of variable resistance 6. If the reference resistance Rref is determined to a resistance between the lowest resistance of the resistances of all of the memory elements of variable resistance in the high resistance state and the highest resistance of the resistances in the low resistance state, it is possible to set the resistance of the reference resistance element 3*c* to a resistance between the resistance of the memory elements of variable resistance 6 in the high resistance state and the resistance in the low resistance state, thereby accurately judging the storage condition of the memory elements of variable resistance 6 and also accurately reading out the data stored in the memory elements of variable resistance 6.

However, it takes a considerable time and requires complicated operations to measure the resistances of all of the memory elements of variable resistance 6 in the high resistance state and in the low resistance state.

Accordingly, descriptions will be made hereunder on two kinds of methods of easily and simply determining the reference resistance Rref to a resistance between the lowest resistance of the resistances of all of the memory elements of variable resistance 6 in the high resistance state and the highest resistance of the resistances in the low resistance state. It is to be noted that the storage unit 1c is used in the following description.

Firstly, a first method of determining the reference resistance will be described by reference to FIG. 7.

Figure 7:
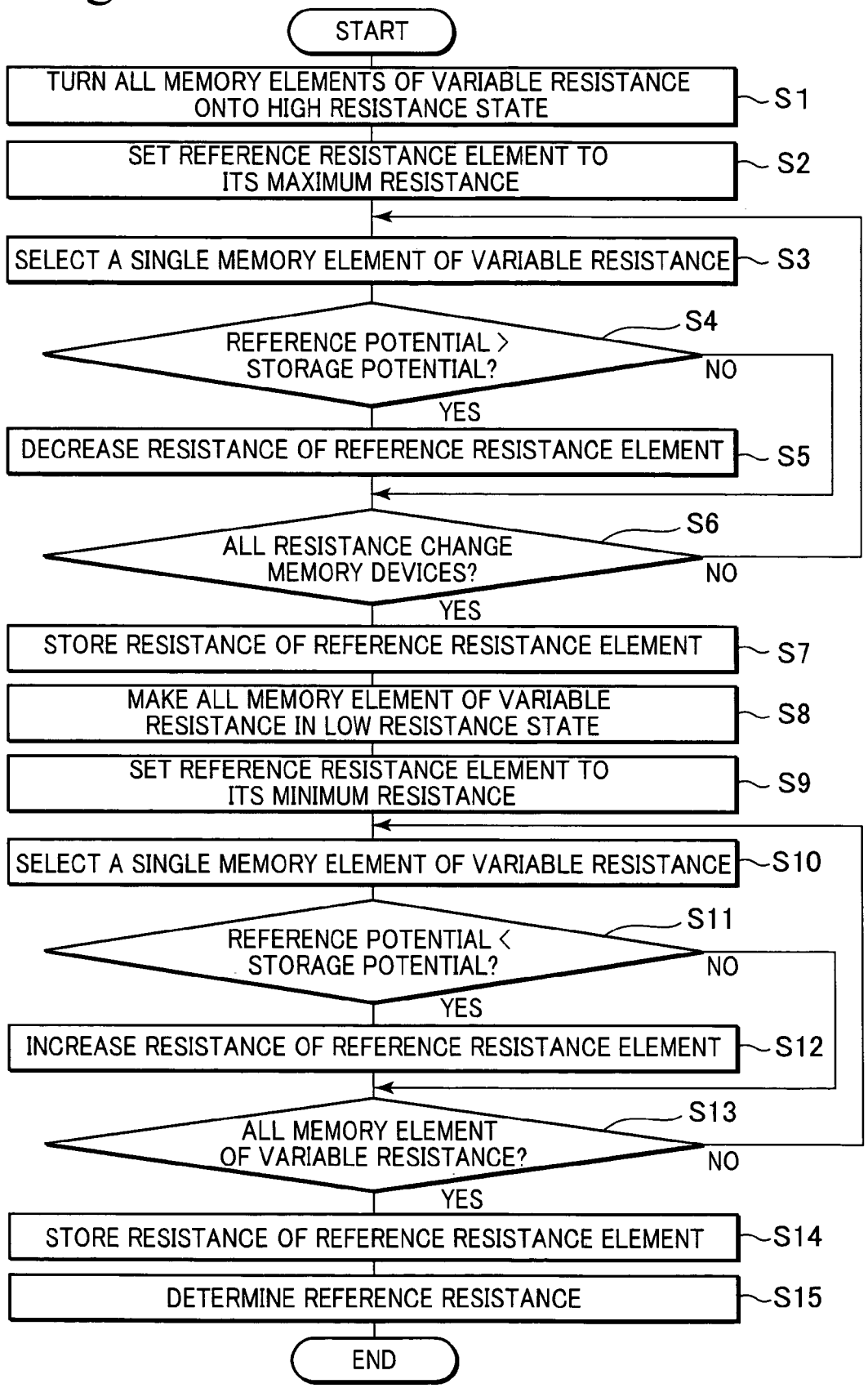
FIG. 7 is a flowchart for describing a first method of determining the reference resistance.

As shown in FIG. 7, in the first method of determining the reference resistance, all of the memory elements of variable resistance 6 are firstly made in the high resistance state (step S1).

Then, the resistance of the reference resistance element 3c is initialized to the setting of the highest possible resistance (step S2). Such initial setting is carried out by changing the gate voltage of the nMOS transistor which constitutes the reference resistance element 3c by the converter 20 based on the reference resistance control signal outputted from the control unit 12, thereby varying the ON resistance of the nMOS transistor.

Subsequently, one of the memory elements of variable resistance 6 is sequentially selected from all of the memory elements of variable resistance 6 (step S3). Such selection is carried out by selecting one of the memory elements of variable resistance 6 from the plurality of memory elements of variable resistance 6 under control of the line address decoder 15 and the column address decoder 16 based on the address signal outputted from the control unit 12.

Then, a comparison is made on the reference potential and the storage potential of the selected one of the memory elements of variable resistance 6 (step S4). Such potential comparison is made in the control unit 12.

In addition, if the storage potential is higher than the reference potential, the resistance of the reference resistance element 3c is decreased so that the reference potential is equal to the storage potential (step S5). Such decrease in resistance of the reference resistance element 3c is carried out by the procedure of gradually decreasing the resistance of the reference resistance element 3c by the reference resistance control signal outputted from the control unit 12 while comparing the reference potential and the storage potential until the reference potential and the storage potential are equalized.

On the other hand, if the storage potential is higher than the reference potential, the resistance of the reference resistance element 3c is not varied.

The above steps S3 to S5 are carried out on all of the memory elements of variable resistance 6 (step S6).

Upon completion of the above steps S3 to S5 on all of the memory elements of variable resistance 6, the resistance of the reference resistance element 3c is ultimately set to the lowest resistance of the resistances of all of the memory elements of variable resistance 6 in the high resistance state. This is because, at every performance of the procedure in the above step S5, the resistance of the reference resistance element 3c is set to the lowest resistance of the memory elements of variable resistance 6 in the high resistance state.

Therefore, if the above-mentioned steps S3 to S5 have been carried out on all of the memory elements of variable resistance 6, the resistance of the reference resistance element 3c at that time is stored in the control unit 12 as the minimum resistance Rmin in the high resistance state (step S7).

Subsequently, all of the memory elements of variable resistance 6 are made into the low resistance state (step S8).

Then, the resistance of the reference resistance element 3c is initialized to the minimum resistance (step S9). Such initial setting is carried out by varying the gate voltage of the nMOS transistor which constitutes the reference resistance element 3c by the converter 20 based on the reference resistance control signal outputted from the control unit 12.

Then, a single memory element of variable resistance 6 is sequentially selected from all of the memory elements of variable resistance 6 (step S10). Such selection of the memory elements of variable resistance 6 is carried out to select a single memory element of variable resistance 6 from the plurality of memory elements of variable resistance 6 by the line address decoder 15 and the column address decoder 16 based on the address signal outputted from the control unit 12.

Subsequently, on the selected single memory element of variable resistance 6, the reference potential and the storage potential are compared (step S11). Such potential comparison is carried out in the control unit 12.

In addition, if the storage potential is higher than the reference potential, the resistance of the reference resistance element 3c is increased so that the reference potential and the storage potential are equalized (step S12). Such resistance increase of the reference resistance element 3c is carried out in the procedure to gradually increase the resistance of the reference resistance element 3c by the reference resistance control signal outputted from the control unit 12 while comparing the reference potential and the storage potential in the control unit 12 until the reference potential and the storage potential are equalized.

On the other hand, if the storage potential is lower than the reference potential, the resistance of the reference resistance element 3c is not varied.

The above mentioned steps S10 to S12 are carried out on all of the memory elements of variable resistance 6 (step S13).

By carrying out the above mentioned steps S10 to S12 on all of the memory elements of variable resistance 6, the resistance of the reference resistance element 3c is ultimately set to the highest resistance of all of the memory elements of variable resistance 6 in the low resistance state. This is because, at every time when step 12 is carried out, the resistance of the reference resistance element 3c is varied to the lowest resistance of the resistances of the memory elements of variable resistance 6 which are selected so far.

Accordingly, when the above mentioned steps S10 to S12 have been carried out on all of the memory elements of variable resistance 6, the resistance of the reference resistance element 3c at that time is stored in the control unit 12 as the maximum resistance Rmax in the low resistance state (step S14).

Finally, the resistance of the reference resistance element 3c is set to a resistance (the reference resistance Rref) between the minimum resistance Rmin in the high resistance state and the maximum resistance Rmax in the low resistance state (step S15). It is to be noted here that the reference resistance Rref may be any resistance between the minimum resistance Rmin in the high resistance state and the maximum resistance Rmax in the low resistance state, but it is preferable to be the center resistance between the minimum resistance Rmin in the high resistance state and the maximum resistance Rmax in the low resistance state.

In the above mentioned first method of determining the reference resistance, it is unnecessary to make actual measurements of the resistance of each of the memory elements of variable resistance 6 but requires only to increase or decrease the resistance of the reference resistance element 3$c$ by simply comparing the reference potential and the storage potential, thereby enabling to determine the reference resistance Rref in short time and by simple operations.

It is to be noted that, in the above mentioned first method of determining the reference resistance in which the minimum resistance Rmin in the high resistance state is detected first (steps S1 to S7) before detecting the maximum resistance Rmax in the low resistance state (steps S8 to S14). However, it is to be noted that the procedure may be reversed.

Figure 8:
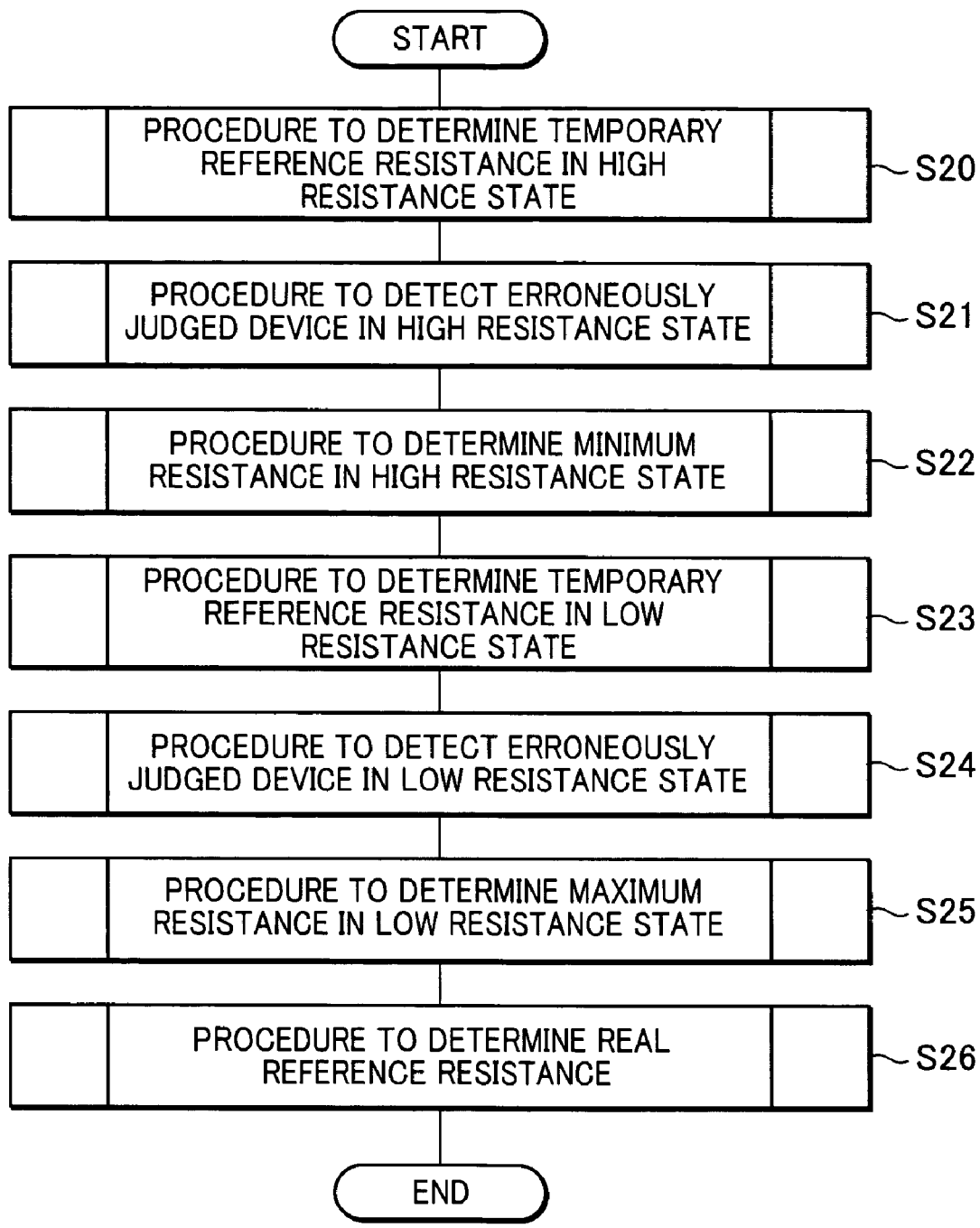
FIG. 8 is a flowchart for describing a second method of determining the reference resistance.

Next, a second method of determining the reference resistance will be described by reference to FIG. 8 and FIG. 9.

Firstly, a part of the memory elements of variable resistance 6 out of the plurality of memory elements of variable resistance 6 are used to perform a procedure to determine a temporary reference resistance R'ref$_0$ in the high resistance state (step S20 which is referred to as "a procedure to determine temporary reference resistance in the high resistance state" below).

In such procedure to determine temporary reference resistance in the high resistance state, a temporary reference resistance R'ref$_0$ in the high resistance state is determined to the lowest resistance of the resistances in the high resistance state of a part of memory elements of variable resistance (referred to as "primary subject memory elements" below) 6 of the plurality of memory elements of variable resistance 6.

Specifically, the lowest resistance in the high resistance state of all of the primary subject memory elements is sought by using the above described first method of determining the reference resistance (steps S1 to S7) and the value in the high resistance state is determined as the temporary reference resistance R'ref$_0$.

Then, the resistance state is determined on the memory elements of variable resistance 6 other than the primary subject memory elements (referred to as "temporary subject memory elements" below) 6 by using the temporary reference resistance R'ref$_0$ as determined in the procedure to determine temporary reference resistance in the high resistance state as described hereinabove, thereby performing procedure to detect memory elements of variable resistance 6 whose resistance states are erroneously judged (step S21 which is referred to as "a procedure to detect erroneously judged devices in high resistance state" below).

Figure 9:
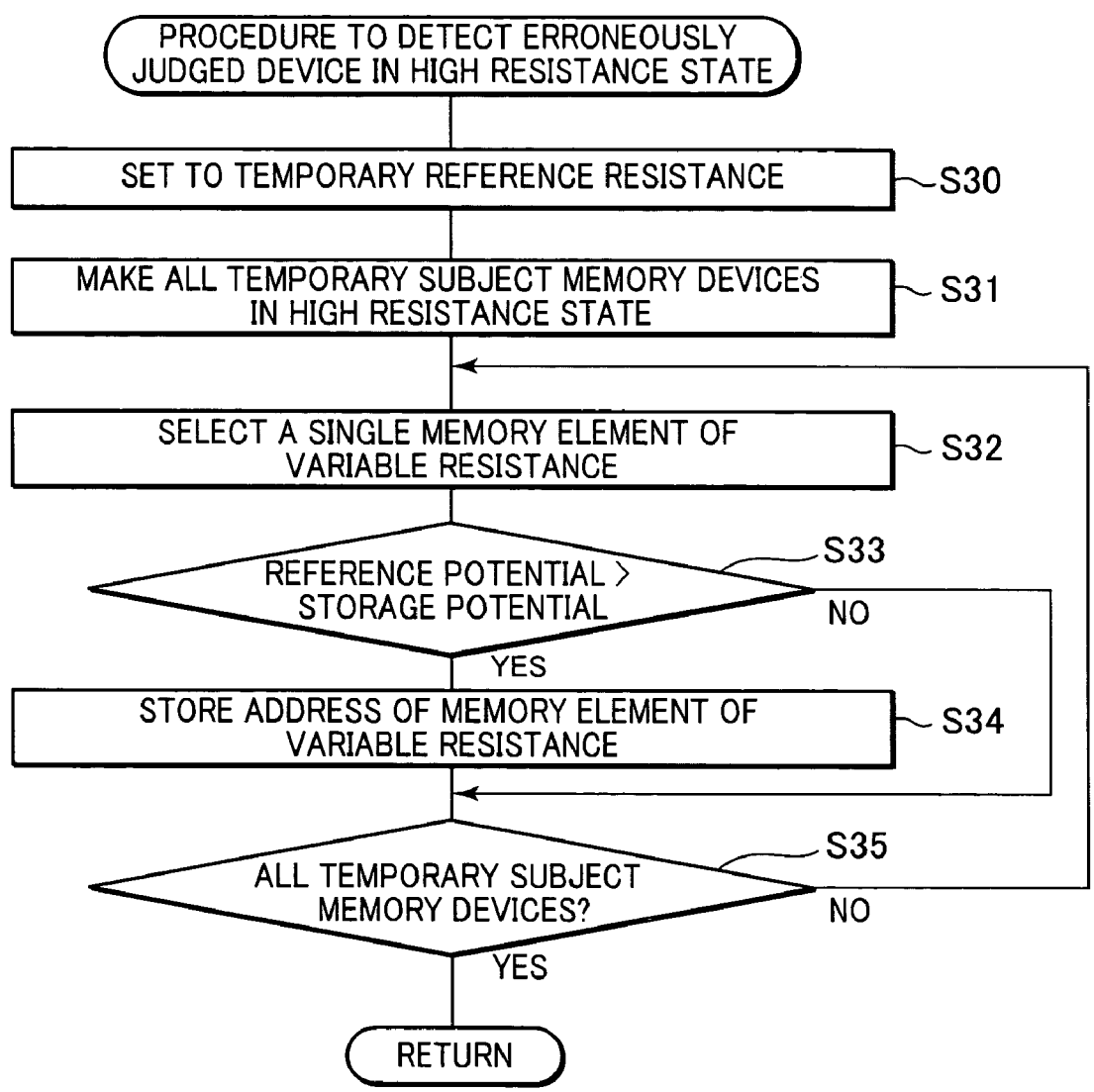
FIG. 9 is a flowchart for describing a procedure to detect erroneously judged device in the second method of determining the reference resistance.

In such procedure to detect erroneously judged devices in high resistance state, as shown in FIG. 9, the resistance of the reference resistance device 3$c$ is first set to the temporary reference resistance R'ref$_0$ in the high resistance state (step S30). Such setting is carried out by changing the gate voltage of an nMOS transistor which constitutes the reference resistance element 3$c$ by the converter 20 based on the reference resistance control signal outputted from the control unit 12, thereby varying the ON resistance of the nMOS transistor.

Next, all of the temporary subject memory elements are made into the high resistance state (step S31).

Then, a single memory element of variable resistance 6 is then sequentially selected from all of the temporary subject memory elements (step S32). Such selection of the memory elements of variable resistance 6 is made by selecting a single memory element of variable resistance 6 out of the plurality of the memory elements of variable resistance 6 by the line address decoder 15 and the column address decoder 16 based on the address signal outputted from the control unit 16.

Then, the reference potential and the storage potential of the selected single memory element of variable resistance 6 are then compared (step S33). Such potential comparison is carried out in the control unit 12.

If the storage potential is lower than the reference potential, the address of the memory element of variable resistance 6 is stored in the control unit 12 (step S34).

On the other hand, if the storage potential is higher than the reference potential, the address of such memory element of variable resistance 6 is not stored.

The above mentioned steps S32 to S34 are repeated on all of the temporary subject memory elements (step S35).

By carrying out the above mentioned steps S32 to S34 on all of the temporary subject memory elements, it is possible to detect memory elements of variable resistance 6 in which the resistances of the temporary subject memory elements in the high resistance state are lower than the temporary reference resistance R'ref$_0$.

By carrying out the above mentioned procedure to detect erroneously judged devices in the high resistance state, it is possible to detect any memory element of variable resistance 6 among the memory elements of variable resistance 6 other than the primary subject memory elements in which the resistance in the high resistance state is lower than the temporary reference resistance R'ref$_0$ (such memory elements of variable resistance are referred to as "secondary subject memory elements" below).

Subsequently, a procedure to determine the minimum resistance Rmin in the high resistance state is carried out using only the secondary subject memory elements (step S22 which is referred to as "a procedure to determine the minimum resistance in the high resistance state" below).

Specifically, the minimum resistance in the high resistance state is detected by using the abovementioned first method of determining the reference resistance (steps S1 to S7) on all of the secondary subject memory elements and the value is defined as the minimum resistance Rmin in the high resistance state.

Subsequently, a procedure to determine a temporary reference resistance R'ref$_1$ in the low resistance state is carried out by using a part of the memory elements of variable resistance 6 among the plurality of memory elements 6 (step S23 which is referred to as "a procedure to determine temporary reference resistance in the low resistance state" below).

In such procedure to determine the temporary reference resistance in the low resistance state, the lowest resistance of the resistances of a part of the memory elements of variable resistance 6 among the plurality of memory elements of variable resistance 6 (referred to as "primary subject memory elements" below) in the low resistance state is determined as a temporary reference resistance R'ref$_1$.

Specifically, the highest resistance in the low resistance state is detected by using the abovementioned first method of determining the reference resistance (steps S8 to S14) on all of the first subject memory elements and the value is defined as the temporary reference resistance R'ref$_1$ in the low resistance state.

Then, the resistance state is judged on the memory elements of variable resistance 6 other than the primary subject memory elements (referred to as "temporary subject memory elements below) by using the temporary reference resistance R'ref$_1$ as determined in the above procedure to determine temporary reference resistance in the low resistance state and to carry out a procedure to detect any memory elements of variable resistance 6 whose resistance state is erroneously judged (step S24 which is referred to, as "a procedure to detect erroneously judged device in the low resistance state" below).

In such procedure to detect erroneously judged devices in the low resistance state, similarly to the above mentioned procedure to detect erroneously judged devices (see FIG. 9), the resistance of the reference resistance element 3c is first set to the temporary reference resistance R'ref$_1$ in the low resistance state. Such setting is made by varying the gate voltage of an nMOS transistor which constitutes the reference resistance element 3c by the converter 20 based on the reference resistance control signal outputted from the control unit 12, thereby varying the ON resistance of the nMOS transistor.

Now, all of the temporary subject memory elements are made into the low resistance state.

Then, a single memory element of variable resistance 6 is sequentially selected from all of the temporary subject memory elements. Such selection of the memory elements of variable resistance 6 is carried out by selecting a single memory element of variable resistance 6 from the plurality of memory elements of variable resistance by the line address decoder 15 and the column address decoder 16 based on the address signal outputted from the control unit 12.

Then, the reference potential and the storage potential of the selected single memory element of variable resistance 6 are compared. Such potential comparison is carried out in the control unit 12.

If the storage potential is higher than the reference potential, the address of such memory element of variable resistance 6 is stored in the control unit 12.

On the contrary, if the storage potential is lower than the reference potential, the address of such memory element of variable resistance 6 is not stored.

The procedure as described hereinabove is repeated on all of the temporary subject memory elements. In this manner, it is possible to detect the memory elements of variable resistance 6 out of the temporary subject memory elements in which the resistances are higher than the temporary reference resistance R'ref$_1$ in the low resistance state.

By carrying out the above mentioned procedure to detect erroneously judged devices in the low resistance state, it is possible to detect memory elements of variable resistance 6 among those other than the primary subject memory elements in which the resistances in the low resistance state are higher than the temporary reference resistance R'ref$_1$ (referred to as "secondary subject memory elements" below).

Subsequently, a procedure to determine the maximum resistance Rmax in the low resistance state is carried out on only the secondary subject memory elements below (step S25 which is referred to as "a procedure to determine maximum resistance in the low resistance state" below).

In such procedure to determine maximum resistance in the low resistance state, the maximum resistance Rmax in the low resistance state is determined among the resistances in the low resistance state.

Specifically, the maximum resistance in the low resistance state is detected by using the above mentioned first method of determining the reference resistance (steps S8 to S14) on all of the secondary subject memory elements and such value is defined as the maximum resistance Rmax in the low resistance state.

Subsequently, carried out is a procedure to determine the final reference resistance Rref (step S26 which is referred to as "a procedure to determine real reference resistance" below).

In such procedure to determine real reference resistance, the reference resistance Rref is set to a resistance between the lowest resistance (the minimum resistance Rmin) of the resistances in the high resistance state and the highest resistance (the maximum resistance Rmax) of the resistances in the low resistance state.

Specifically, the average (center) value of the minimum resistance Rmin and the maximum resistance Rmax is calculated and the reference resistance Rref is finally determined to such value.

Although the detection in the high resistance state (steps S20 to S22) is carried out before detection in the low resistance state (steps S23 to S25) in the above mentioned second method of determining the reference resistance, such sequence can be reversed.

As understood from the above description, in the second method of determining the reference resistance, the lowest resistance in the high resistance state is detected on a part of the memory elements of variable resistance 6 of the plurality of memory elements of variable resistance 6 to set the value as the temporary reference resistance R'ref$_0$ and the lowest resistance of the resistances of the remaining memory elements of variable resistance 6 which are determined to have lower resistance than the temporary reference resistance R'ref$_0$ in the high resistance state is defined as the minimum resistance Rmin in the high resistance state. On the other hand, the highest resistance of a part of the memory elements of variable resistance 6 in the low resistance state is detected and the value is set as the temporary reference resistance R'ref$_1$ and the highest resistance of the resistances of the remaining memory elements of variable resistance 6 which are determined to have a higher resistance than the temporary reference resistance R'ref$_1$ in the low resistance state is defined as the maximum resistance Rmax in the low resistance state. And the reference resistance Rref is determined to be a resistance between the minimum resistance Rmin in the high resistance state and the maximum resistance Rmax in the low resistance state.

Accordingly, it is possible to reduce the number of resistance detections before determining the reference resistance Rref, thereby enabling to determine the reference resistance Rref in a shorter time.

According to the above mentioned second method of determining the reference resistance, the number of resistance detections required for determining the minimum resistance Rmin in the high resistance state or for determining the maximum resistance Rmax in the low resistance state is equal to the total number (referred to as "the total detection number" below) of the number of the primary subject memory elements and the number of the secondary subject memory elements.

Now, the number of the primary subject memory elements which is able to make the total detection number as small as possible will be described hereunder.

2. It is assumed that the resistances of the memory elements of variable resistance 6 follow the normal distribution. The normal distribution is expressed by the following expression:

[Expression 1]

$$D(x, \mu, \sigma) = \frac{1}{\sqrt{2\pi}\,\sigma} \exp\left[-\frac{(x-\mu)^2}{2\sigma^2}\right] \quad (1)$$

Where, x represents the resistance, μ is the average value and σ is the standard deviation.

Let the total number of memory elements of variable resistance 6 be $N_0$ and the number of the primary subject memory elements be $N_1$, and then probability that the maximum value in the procedure of determining the temporary reference resistance is Xmax can be given by the following expression:

[Expression 2]

$$P(x_{max}) = N_1 D(x_{max}, \mu, \sigma) \left[\int_{-\infty}^{x_{max}} D(x, \mu, \sigma) dx\right]^{N_1 - 1} \quad (2)$$

Accordingly, the expected value of the maximum value is given by the following expression:

[Expression 3]

$$\overline{x_{max}} = \int_{-\infty}^{\infty} x_{max} P(x_{max}) dx_{max} \quad (3)$$

Figure 10:
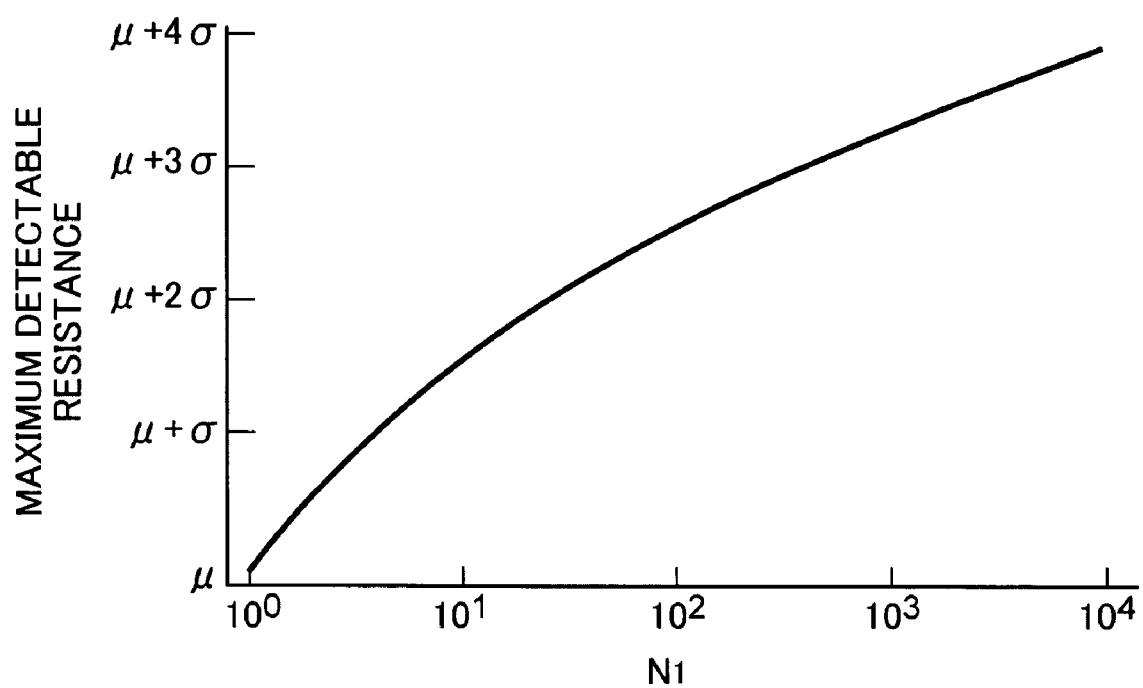
FIG. 10 is a graph showing a relationship between the number $N_1$ in the primary memory elements and the maximum resistance to be detected in a procedure to detect a temporary reference resistance.

This relationship is graphically shown in FIG. 10. FIG. 10 shows the relationship between the number $N_1$ and the maximum resistance which can be detected in the procedure to determine temporary reference resistance. It is apparent from FIG. 10 that a larger maximum resistance can be detected as the number $N_1$ of the primary subject memory elements increases.

And by carrying out the procedure to detect erroneously judged devices based on the maximum resistance as detected in the procedure to determine temporary resistance, the number $N_2$ of the secondary subject memory elements is given by the following expression:

[Expression 4]

$$N_2 = N_0 \int_{\overline{x_{max}}}^{\infty} D(x, \mu, \sigma) dx \quad (4)$$

Figure 11:
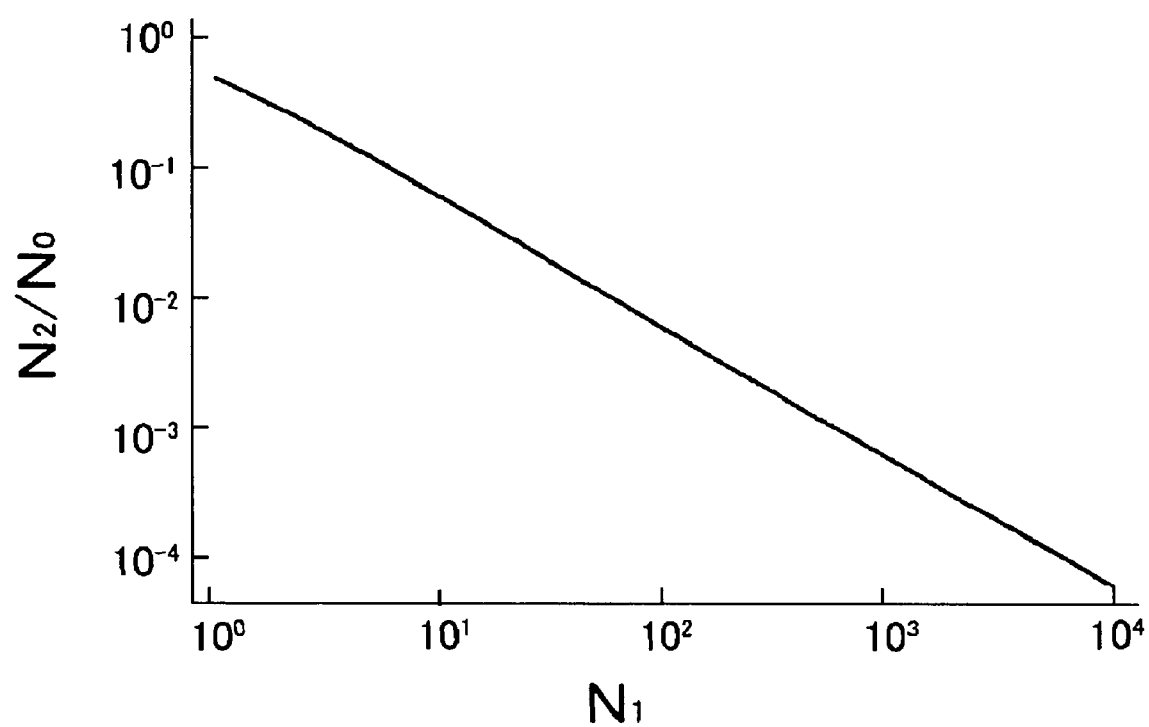
FIG. 11 is a graph showing the relationship between the number $N_1$ of primary memory elements and the number $N_2$ of secondary memory elements.

As apparent from the foregoing, the relationship between the number $N_1$ of the primary subject memory elements and the number $N_2$ of the secondary subject memory elements is shown in FIG. 11. It is understood that larger the number $N_1$ of the primary subject memory elements smaller is the number $N_2$ of the secondary subject memory elements.

Figure 12:
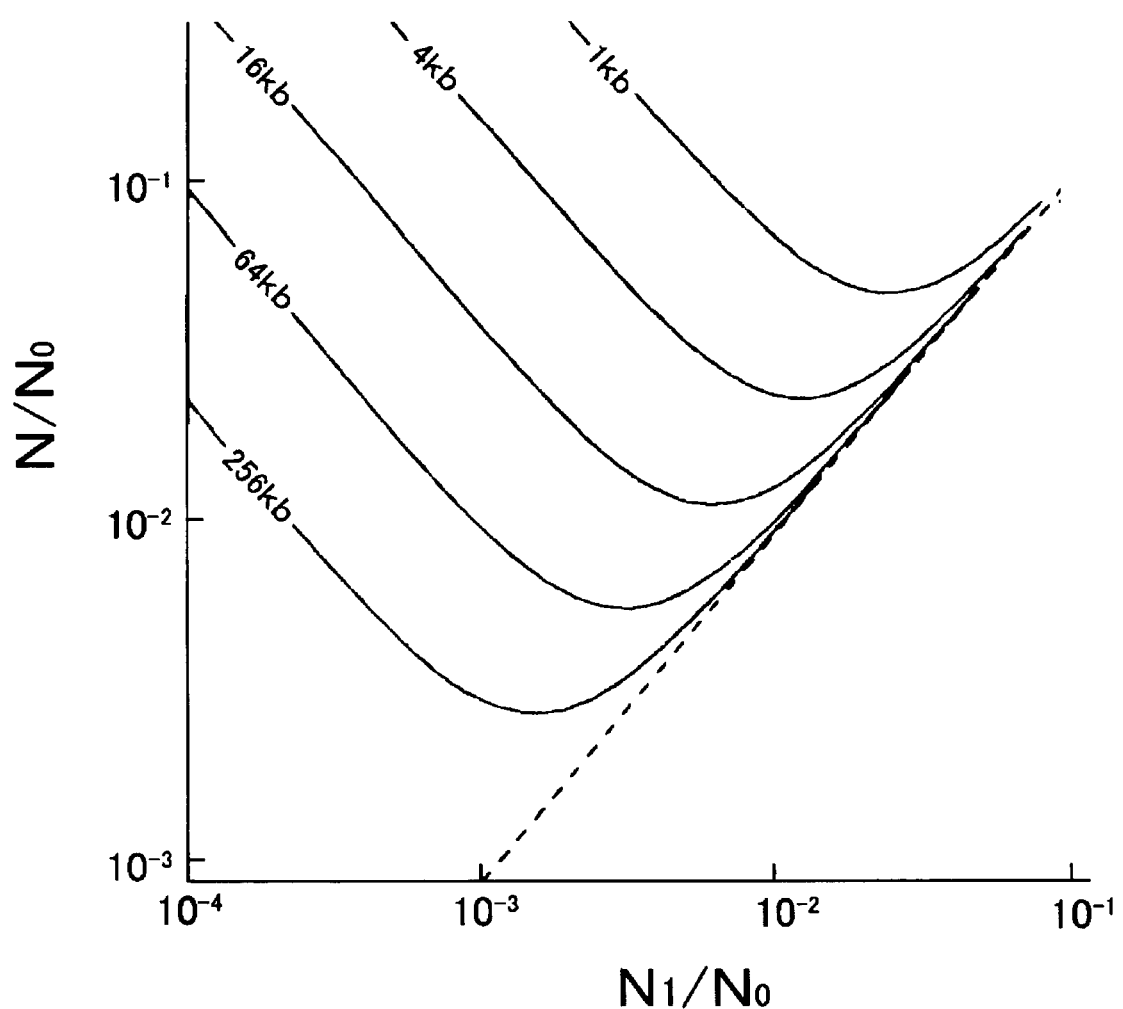
FIG. 12 is a graph showing the relationship between the number $N_1$ of primary memory elements and the total detection number N.

Since the total detection number N is the total sum of the number of primary subject memory elements $N_1$ and the number of secondary subject memory elements $N_2$, this relationship can be graphically shown in FIG. 12. It is understood from FIG. 12 that there exists the number of primary subject memory elements $N_1$ to minimize the total detection number N depending on the number of total memory elements of variable resistance $N_0$ ($N_0$ is 1 kb, 4 kb, 16 kb, 64 kb and 256 kb in the example as shown in FIG. 12).

Accordingly, if the optimum number of primary subject memory elements $N_1$ is selected as shown in FIG. 12, the total detection number N can be minimized, thereby enabling to determine the minimum resistance Rmin in the high resistance state and the maximum resistance Rmax in the low resistance state in a shorter time and also determining the reference resistance in a shorter time.

For example, in case of the number $N_0$ of all memory elements of variable resistance 6 is 16 kb, if the number of primary subject memory elements $N_1$ is set to 100, the number of secondary subject memory elements $N_2$ is about 100, thereby making the total detection number N equal to about 200. This means that the detection number for detecting the minimum resistance Rmin in the high resistance state or the maximum resistance Rmax in the low resistance state can be about 1/82 as compared to detection of all of the 16 kb memory elements of variable resistance 6.

Although all secondary subject memory elements are subjected to be processed in the above mentioned procedure to determine the real reference resistance, it is also possible to reduce the total detection number N by carrying out the procedure to determine temporary reference resistance on a part of the secondary subject memory elements before carrying out the procedure to determine the real reference resistance on the remaining devices.

For example, in case when the total number $N_o$ of the memory elements of variable resistance 6 is 16 kb, if the number of primary subject memory elements $N_1$ is set to 17, the number of secondary subject memory elements $N_2$ is about 590. If the procedure to determine the temporary reference resistance is carried out again on 16 out of the about 590 devices, the number of devices subjected to the procedure to determine the real reference resistance is about 21, thereby making the total detection number N equal to about 54. This is about 1/300 in total detection number for detecting the minimum resistance Rmin in the high resistance state or the maximum resistance Rmax in the low resistance state as compared to resistance detections on all of the 16 kb memory elements of variable resistance.

INDUSTRIAL APPLICABILITY (1) In the present invention as defined in claim 1, since the resistance of the reference resistance element is made variable, the storage condition of the memory element of variable resistance can be accurately judged and the data stored in the memory element of variable resistance can be read out accurately by varying the resistance of the reference resistance element to a resistance between the resistance of the memory element of variable resistance in the high resistance state and the resistance of the resistance change memory element in the low resistance state even if the memory element of variable resistance demonstrated individual difference in resistance.

(2) In the present invention as defined in claim 2, the reference circuit of the resistance element and the reference resistance element connected in series between two reference potential terminals of different potentials and the memory circuit of a series connection of the resistance element and the memory element of variable resistance with the reference circuit and the memory circuit connected in parallel with each other, and yet the reference resistance element is constructed to exhibit variable resistance, thereby making the circuit configuration simple and less expensive. Even if there is any individual difference in the resistance of the memory element of variable resistance, by varying the resistance of the reference resistance element to a resistance between the resistance of the memory element of variable resistance in the high resistance state and the resistance element in the low resistance state, it is possible to accurately judge the storage condition of the memory element of variable resistance and to accurately read out the data stored in the memory element of variable resistance.

(3) In the present invention as defined in claim 3, the reference circuit of the first resistance element and the reference resistance element connected in series between two reference potential terminals of different potentials and the memory circuit of a series connection of the second resistance element and a single memory element of variable resistance selected from a plurality of resistance memory elements with the reference circuit and the memory circuit connected in parallel with each other, and yet the reference resistance element is constructed to be variable, thereby making the circuit configuration simple and less expensive. Even if there is any individual difference in the resistances of the plurality of memory elements of variable resistance, by varying the resistance of the reference resistance element between the resistance of the memory element of variable resistance in the high resistance state and the resistance element in the low resistance state, it is possible to accurately judge the storage conditions of all of the memory elements of variable resistance and to accurately read out the data stored in all of the memory elements of variable resistance.

(4) In the present invention as defined in claim 4, since the resistance of the resistance element in the memory circuit is made variable, it is possible to increase or decrease the voltage applied across the memory element of variable resistance by increasing or decreasing the resistance of the resistance element in the memory circuit, thereby enabling to adjust the voltage across the memory element of variable resistance to the optimum voltage and thus extending the lifetime of the memory element of variable resistance.

(5) In the present invention as defined in claim 5, since the resistance of the resistance element in the reference circuit can be varied equal to the resistance of the resistance element in the memory circuit, the resistance of the reference resistance element can be made equal to the resistance of the memory element of variable resistance by equalizing the voltage across the memory element of variable resistance and the voltage across the reference resistance element, thereby making measurement of the resistance of the reference resistance element equivalent to measurement of the resistance of the memory element of variable resistance, indirectly measuring the resistance of the memory element of variable resistance and immediately judging the storage condition of the memory element of variable resistance.

(6) In the present invention as defined in claim 6, the potential on the junction of the resistance element and the reference resistance element in the reference circuit is defined as the reference potential, the potential on the junction of the resistance element and the memory element of variable resistance in the memory circuit is defined as the storage potential, the reference potential and the storage potential are compared to make a judgment that the resistance state of the memory element of variable resistance is in the high resistance state if the storage potential is higher than the reference potential, while making a judgment that the resistance state of the memory element of variable resistance is in the low resistance state if the storage potential is lower than the reference potential, thereby enabling to make a judgment of the resistance state of the memory element of variable resistance from the potential difference between the reference potential and the storage potential and making the circuit configuration for judging the resistance state of the memory element of variable resistance simple and less expensive.

(7) In the present invention as defined in claim 7, since the reference resistance is determined to a resistance between the lowest resistance of the resistances of the memory elements of variable resistance in the high resistance state and the highest resistance of the resistances in the low resistance state, it is possible to set the resistance of the reference resistance between the resistance of the memory elements of variable resistance in the high resistance state and the resistance in the low resistance state even if there is any individual difference in the memory elements of variable resistance, thereby enabling to accurately judging the storage condition of the memory element of variable resistance and accurately read out the data stored in the memory element of variable resistance.

(8) In the present invention as defined in claim 8, the lowest resistance of a part of memory elements of variable resistance among the plurality of memory elements of variable resistance in the high resistance state is detected to set the resistance as the temporary reference resistance, and the lowest resistance among the resistances of the remaining memory elements of variable resistance which are judged to be lower than the temporary reference resistance is defined as the minimum resistance in the high resistance state, on the other hand, the highest resistance of a part of the memory elements of variable resistance among the plurality of memory elements of variable resistance in the low resistance state is detected to set the resistance as the temporary reference resistance, the highest resistance among the resistances of the remaining memory elements of variable resistance which are judged to be higher than the temporary reference resistance in the low resistance state is defined as the maximum resistance in the low resistance state, and a resistance between the minimum resistance in the high resistance state and the maximum resistance in the low resistance state is determined as the reference resistance, thereby enabling to reduce the number of resistance detections of the memory elements of variable resistance for determining the reference resistance and thus ensuring to determine the reference resistance in short time.

The invention claimed is:

1. A memory apparatus using a memory element of variable resistance which changes between a high resistance state having a higher resistance than a resistance of a reference resistance element and a low resistance state having a lower resistance than the resistance of the reference resistance element in response to two kinds of data to be stored, the memory apparatus using a memory element of variable resistance characterized by a structure having the resistance of the reference resistor made variable.

2. A memory apparatus using a memory element of variable resistance which changes between a high resistance state having a higher resistance than a resistance of a reference resistance element and a low resistance state having a lower resistance than the resistance of the reference resistance element in response to two kinds of data to be stored, the memory apparatus using a memory element of variable resistance characterized by a structure in which a reference circuit, made of a first resistance element and the reference resistance element connected in series between reference potential terminals set to different potentials, and a memory circuit, made of a second resistance element and the memory element of changeable resistance connected in series, are connected in parallel, wherein the resistance of the reference resistance is variable.

3. A memory apparatus using a memory element of variable resistance which changes between a high resistance state having a higher resistance than a resistance of a reference resistance element and a low resistance state having a lower resistance than the resistance of the reference resistance element in response to two kinds of data to be stored, the memory apparatus using a memory element of variable resistance characterized by a structure in which a reference circuit, made of a first resistance element and the reference resistance element connected in series between reference potential terminals set to different potentials, and a memory circuit, made of a second resistance element and a memory element of variable resistance selected from a plurality of memory elements of variable resistances connected in series, both connected in parallel, wherein the resistance of the reference resistance is variable.

4. The memory apparatus using a memory element of variable resistance as claimed in claim 2 or 3, wherein the second resistance element has a variable resistance.

5. The memory apparatus using a memory element of variable resistance as claimed in any of claims 2 to 4, wherein the first resistance element is variable so as to have a same resistance as the resistance of the second resistance element.

6. The memory apparatus using a memory element of variable resistance as claimed in any of claims 2 to 5, wherein an electric potential on a junction between the first resistance element and the reference resistance element is a reference potential, the potential on a junction between the second resistance element and the memory element of variable resistance is a memory potential, and comparison is made between the reference potential and the memory potential to judge that the resistance of the memory element of variable resistance is in a high resistance state if the memory potential is higher than the reference potential, while the memory element of variable resistance is in a low resistance state if the memory potential is lower than the reference potential.

7. A memory apparatus using a plurality of memory elements of variable resistance which change between a high resistance state having a higher resistance than a reference resistance and a lower resistance state having a lower resistance than the reference resistance in response to two kinds of data to be stored, wherein the reference resistance is determined as a resistance between a lowest resistance among the memory elements of variable resistances in the high resistance state and the highest resistance in the low resistance state.

8. A reference resistance determination method for a memory apparatus using a memory element of variable resistance, comprising the steps of:

setting a lowest resistance among part of a plurality of memory elements of variable resistance in a high resistance state as a temporary reference resistance;

setting a lowest resistance among memory elements of variable resistance within the remaining memory elements of variable resistance determined as having lower resistance than the temporary reference resistance in the high resistance state as a lowest resistance in the high resistance state;

setting a highest resistance among part of the plurality of memory elements of variable resistance in a low resistance state as a temporary reference resistance;

setting a highest resistance among memory elements of variable resistance within the remaining memory elements of variable resistance determined as having higher resistance than the temporary reference resistance in the low resistance state as a highest resistance in the low resistance state; and determining a resistance between the lowest resistance in the high resistance state and the highest resistance in the low resistance state as the reference resistance.

* * * * *